US006441303B1

(12) United States Patent
Daume

(10) Patent No.: US 6,441,303 B1
(45) Date of Patent: *Aug. 27, 2002

(54) DEVICE FOR ELECTRICALLY CONTACTING AND SEALING A TUBULAR MEMBER

(75) Inventor: Britta Daume, Burgwedel (DE)

(73) Assignee: Karin Daume Maschinenteile, GmbH & Co. KG, Burgwedel (DE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/383,391

(22) Filed: Aug. 26, 1999

(30) Foreign Application Priority Data

Sep. 15, 1998 (DE) .................................... 298 16 332 U
May 19, 1999 (EP) ........................................... 99109808

(51) Int. Cl.[7] .............................................. H05K 5/02
(52) U.S. Cl. .......................................... 174/51; 174/48
(58) Field of Search ..................................... 174/48, 51

(56) References Cited

U.S. PATENT DOCUMENTS

| | | | | |
|---|---|---|---|---|
| 2,432,492 A | | 12/1947 | Tinnerman | 174/40 |
| 3,891,291 A | | 6/1975 | Nadsady et al. | 339/15 |
| 3,999,825 A | * | 12/1976 | Cannon | 174/94 S |
| 4,659,870 A | * | 4/1987 | Jones | 174/84 S |
| 5,242,471 A | * | 9/1993 | Nakahama et al. | 524/526 |
| 5,313,019 A | | 5/1994 | Brusselmans et al. | 174/93 |
| 5,698,639 A | * | 12/1997 | Nakahama et al. | 525/332.4 |
| 5,710,218 A | * | 1/1998 | Nakahama et al. | 525/211 |

FOREIGN PATENT DOCUMENTS

| | | | |
|---|---|---|---|
| DE | 26 56 885 A1 | 6/1977 | F16L/27/00 |
| DE | 198 42 377 | 2/2000 | H02G/15/13 |
| EP | 0 035 630 | 9/1981 | C08L/23/08 |
| EP | 0 165 691 A1 | 12/1985 | F16L/21/06 |
| EP | 0 446 380 | 9/1991 | C08K/3/06 |
| EP | 0 446 382 | 9/1991 | B63B/43/06 |
| EP | 0 744 788 A1 | 11/1996 | H01R/4/64 |
| WO | WO 90 13599 | 11/1990 | C08L/9/02 |

* cited by examiner

*Primary Examiner*—Jeffrey Sterrett
(74) *Attorney, Agent, or Firm*—Shlesinger, Arkwright & Garvey LLP

(57) ABSTRACT

The invention related to a device (2) to set up an electrically conducting contact, and in particular, of an elongated, illustratively, a substantially cylindrical body, for instance a pipe or a cable, and comprises a base structure (4) to rest against the body (42) to be contacted and a contact element (40) held at a side of the base structure (4) which in the assembly position faces the body (42) to be contacted, this contact element implementing an electrically conducting connection with the body (42) to be contacted. The invention provides adjusting means to adjust the position of the contact element (40) relative to the edges of the base structure (4). The invention reliably precludes, at manufacture of the device (2), that there will be slippage of, or projection by the contact element (40) beyond the edge of the base structure (4) when the contact element (40) is affixed to the base structure (4). This feature simplifies manufacture and saves the time and costs of refinishing work.

14 Claims, 7 Drawing Sheets

DEVICE FOR ELECTRICALLY CONTACTING AND SEALING A TUBULAR MEMBER

FIELD OF THE INVENTION

The present invention relates to a device for contacting, in particular, elongated, illustratively substantially cylindrical bodies such as cables or pipes or tubes, where hereafter the word "pipe" also includes the meaning of "tube".

BACKGROUND OF THE INVENTION

Such devices are used for instance to connect a metallic pipe or a bared outer conductor of a coaxial cable to a grounding cable.

A device of this species is known from the European patent document 0,744,788 A1 and comprises therein a base structure coming to rest against a body to be contacted and a contact element to implement an electrically conducting connection with this body to be connected, this contact element being affixed to a side of the base structure which in the assembly position will face the body to be contacted. In the known device, the base structure comprises a band-shaped metal clamp imbedded in an elastic material, a contacting surface being left free to accommodate the contact element at the side which in the assembly position faces the body to be contacted. The contact element of the known device is a band of copper braid and is manually affixed using adhesive or is spot-welded to the contact surface of the base structure. Seen in topview, the contact element is substantially rectangular and, in the desired affixation position, its longitudinal edges essentially run parallel to adjacent edges of the base structure.

The known device incurs the drawback that the contact element may slip during its affixation and shall then be in a position on the base structure in which its longitudinal edges do not run parallel, but undesirably obliquely to the edges of the base structure and that as a result the contact element projects laterally from the base structure. When assembling the device of the state of the art, the required contact between the contact element and the body to be contacted then might not be implementable as desired. In such a case the contact element must be loosened from the base structure and then be reaffixed to it in the desired position. Such refinishing work takes time and money.

OBJECTS AND SUMMARY OF THE INVENTION

The objective of the invention is to create a device which shall be free of the drawback of the known device, namely which facilitates affixing the contact element in the desired affixation position to the base structure.

The basic concept of the invention is to provide adjusting means allowing to adjust the position of the contact element relative to edges of the base structure. In this manner slipping and projection of the contact element beyond the edge of the base structure are reliable averted when affixing this contact element to the base structure at manufacture of the device of the invention. Consequently manufacture is facilitated and time consuming and hence expensive corrective work is saved.

The device of the invention is rugged in design and can be manufactured in simple and economical manner. Moreover it is widely applicable.

The adjusting means may be designed in versatile manner. Illustratively the adjusting means may be optical, for instance being markings on the base structure. Appropriately however they shall be fitted with at least one rest edge or at least one rest surface slanting to a retaining surface at which the contact element is affixed to the base structure in its affixation mode. The rest edge or rest surface allow adjusting the contact element in its position relative to the edges of the base structure and hence its affixation in the desired affixation position is made easier.

In principle it suffices that the adjusting means be fitted with merely one rest edge or rest surface and that therefore the contact element shall be resting only over a segment of its edge against the rest edge or rest surface. However, in an advantageous further implementation, at least two mutually spaced rest edges or rest surfaces are provided to support the contact element at mutually spaced zones of its edge. As regards a contact element which is substantially rectangular in topview for instance, two mutually substantially parallel and spaced rest edges may be used, the contact element in the affixation position resting opposite zones of its edge against a rest edge in each case. Moreover rest edges subtending an angle between them also may be used, for instance at a right angle. In that case the contact element will rest by adjoining zones of its edge against the rest edges. Again four rest edges may be used which support the contact element at opposite zones of its edge.

In an especially advantageous embodiment of the invention, the adjusting means are centering means to center the contact element between opposite edges of the base structure. In this manner the contact element will be centered between the base-structure edges and the adjustment of contact-element position is simplified further.

In another variant of the above embodiment, the centering means are fitted with mutually spaced rest edges running substantially parallel to each other and to adjacent edges of the base structure. In this variant, a contact element which is essentially rectangular when seen in topview is held in place parallel to the base-structure edges and is centered thereby.

In another embodiment, the centering means are fitted with mutually spaced and relatively slanted rest surfaces extending in the longitudinal as well as the circumferential direction of the base structure and supporting the affixation element when in the affixation position. Centering of the contact element is achieved in the desired manner also in this embodiment.

In a variant of the above embodiment, the rest surfaces slant away from each other. In this manner the rest surfaces form a trough to receive the contact element. However the rest surfaces also may slant toward each other in the manner of another variant. In this latter variant, the rest surfaces for instance may span mutually opposite edges of the contact element.

The shape, size and number of rest edges or surfaces can be selected within wide limits. Appropriately the, or each, rest edge or surface is formed at a protrusion, in particular a stud or a rib formed at the base structure. This variant is simple and economical.

In principle however the, or each, stud or rib may be constituted by a separate element connected to the base structure. In an advantageous variant, however, the base structure is partly made of an elastic material, preferably an elastomer into which is integrated the, or each. stud or the, or each, rib. The, or each, stud or the, or each, rib is therefore integral with a part of the base structure. This feature simplifies the manufacture of the device of the invention. If, in this variant, two mutually spaced rest edges are provided, then, upon an appropriate selection of the spacing between the rest edges of the contact element, this contact element can be clamped between the elastically deforming rest edges and be elastically held in place. As a result additional affixation means to hold the contact element, for instance adhesive or welding, no longer are required.

In another embodiment, the base structure is fitted with a recess of which the edge(s) constitute(s) the, or each, rest edge or of which the slope(s) constitute(s) the, or each, rest surface. This embodiment also assures accurate adjusting of the contact element. Moreover this embodiment allows simple and economical manufacture.

In principle it is enough that the contact element rest by a segment of its edge against the rest edges or surfaces. In an especially advantageous variant of the invention, the contour of the recess substantially corresponds to that of the contact element in such manner that the contact element shall be snugly held in the recess. In this variant, the contact element is precluded in especially reliable manner from slipping.

The material of the base structure can be selected within wide limits. The base structure also may be composed of several materials. In one embodiment, the base structure comprises a band-shaped metal part. Dimensional stability of the base structure is enhanced by the band-shaped metal part. As regards the above embodiment, the recess may be formed at the side of the metal part facing the body to be contacted when in the assembly position. The metal part illustratively may be made of sheetmetal and consequently the recess can be merely embossed, making manufacture even simpler.

In a variant of the above embodiment, the recess is in the form of a bead or a recessed area. Such recesses can be embossed by embossing tools into the metal part of the base structure in arbitrary shapes and sizes.

In principle it is enough that the base structure merely consist of the band-shaped metal part. However, in a variant of the embodiment comprising the elastic part, the metal part is coated at least partly with the elastic material, in particular on its side which in the assembled position will face the body to be contacted, or that the metal part be imbedded in the elastic material, a contact region being left free in the side of the metal part which in the assembly position faces the body to be contacted. The elastic material may be used make the device of the invention more optically pleasing or to protect the metal part against ambient factors or to electrically insulate the metal part.

The shape and size of the contact element can be selected within wide limits. Appropriately the contact element is formed by a flat stranded wire or a flat band or a braided band made of metal. Such contact elements are manufactured easily and economically.

The shape and size of the base structure may be selected within wide limits. Illustratively the base structure may be plate to contact a planar body or it may be curved or bent to contact a curved or bent body.

A particularly advantageous embodiment to contact pipes or cables of arbitrary cross-sectional contours provides a base structure to enclose, when in the assembly position, especially in annular or bush-like manner, the body to be contacted. In this embodiment the base structure is reliably held against the body to be contacted.

In principle the base body may be rigid. However appropriately it will be made flexible to facilitate assembly.

The base structure may be in several segments. Illustratively a device designed to contact a pipe may consist of several segments, for instance two semi-circular segments, which are consecutive along the circumference of the pipe to be contacted. Appropriately however the base structure will be integral and open in the circumferential direction and be fitted at its free ends with brackets which can be joined to each other in the assembly position, preferably using screws or a clamp. Because of the integral design of the base structure of this embodiment, assembly of the device of the invention is simple.

In another variant of the invention, the base body is in the form of a strap that can be tightened around the body to be contacted. This feature again facilitates assembly.

As regards embodiments comprising several studs or ribs fitted with rest edges or surfaces, it is enough, basically, that all studs or ribs run from one edge of the base structure toward the other. In an advantageous variant, however, at least one stud or rib each time shall run from one edge toward the other in the region of two mutually opposite edges and in such manner that in the affixation position, the contact element shall rest by means of two opposite zones of its edge against the studs or ribs. The contact element is centered between the studs or ribs in this variant.

In another variant of the embodiments of the invention using studs or ribs, the studs or ribs consecutive in the longitudinal and circumferential directions of the base structure are provided on different lines running in the longitudinal direction of the base structure or on different lines running in the circumferential direction of the base structure respectively. In this variant, the studs or ribs consecutive in the longitudinal or circumferential directions of the base structure hold the contact element at opposite zones of its edge to achieve centering thereby.

In a variant of the above embodiment, at least two studs or ribs are mounted along a line transverse to the longitudinal direction of the base structure or on a line running in the axial direction respectively. In this embodiment the contact element rests by zones of its edges which are transverse to its longitudinal direction against the studs or ribs to further improve centering.

In an unusually advantageous embodiment of the invention, at least two studs or ribs supporting the contact element in the assembly position are fitted with undercuts in such manner that rest surfaces are formed which slant towards each other and by which, in the affixation position, the studs or ribs overlap mutually opposite edge zones of the contact element. In this embodiment the contact element is held in geometrically locking manner by the studs' or ribs' rest surfaces and consequently additional retaining means such as adhesive are not needed. This feature simplifies manufacture and lowers costs.

Lastly as regards the embodiments relating to a metal part, a variant provides fitting the metal part with at least one aperture, preferably on each side of the contact element to pass the elastic material in such manner that this elastic material on the side of the metal part facing the metal part is joined to the elastic material on the side of the metal part away from the contact element. In this manner the elastic material on the side of the metal part facing the contact element is precluded from detaching from this metal part. Such detachment might degrade the electrical contact between the contact element and the metal part if this contact element were solely held by the elastic material at the metal part

BRIEF DESCRIPTION OF THE DRAWINGS

The invention is elucidated below in relation to the attached drawing showing illustrative embodiments.

DETAILED DESCRIPTION OF THE PREFERRED EMBODIMENTS

Figure 1:
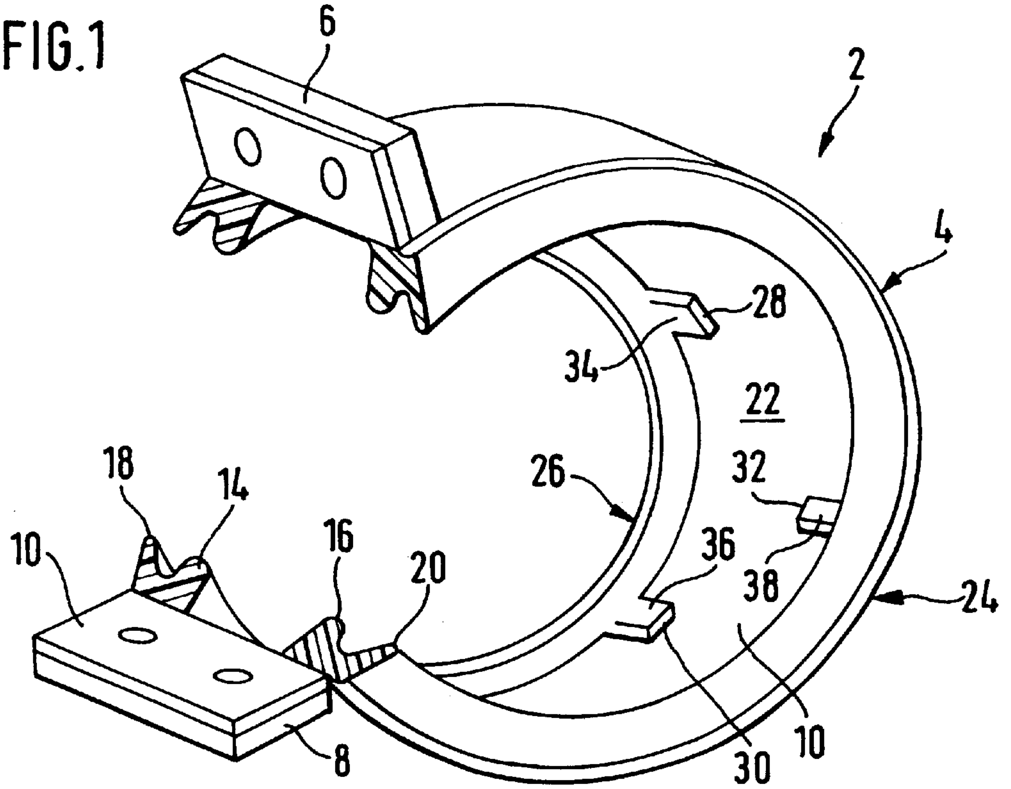
FIG. 1 is a schematic perspective of a first embodiment of the device of the invention in the form of a clamp.

Identical or corresponding components are denoted by identical references in the drawings.

FIG. 1 shows a first embodiment of a device of the invention 2 comprising a flexible base structure 4 in the form of a clamp and in this embodiment being integral and open along the circumferential direction and fitted with brackets 6, 8 substantially perpendicular to its free ends, said brackets being connectable when in the assembly position in a manner elucidated further below.

Figure 4:
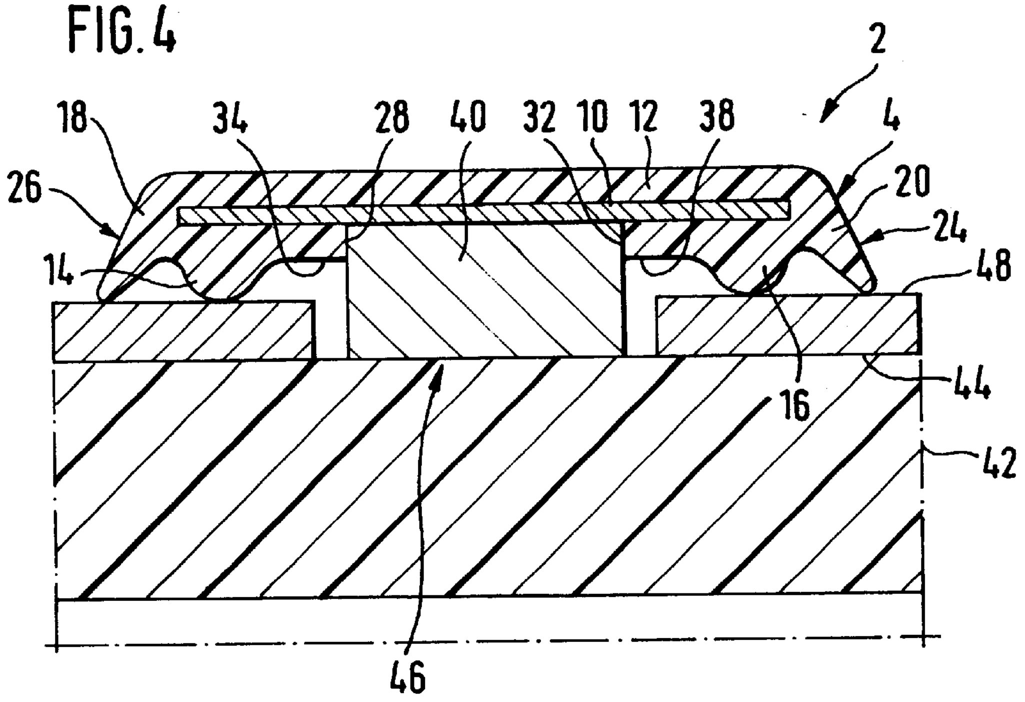
FIG. 4 is a section along a line IV—IV of the device of FIG. 3 in its assembly position.

The base structure 4 comprises a band-shaped metal part 10 and further an elastic part 12 in this instance made of an elastomer embedding the metal part 10 with its axial edges and in this manner connecting the metal part 10 with the elastic part 12 (FIG. 4).

The elastic part 12 forms sealing lips 14, 16 at the side which in the assembly position faces a body to be contacted and additional sealing lips 18, 20 axially external to the sealing lips 14, 16. In the assembly position the base structure 4 rests by the sealing lips 14, 16 and the additional sealing lips 18, 20 in sealing manner against an outer surface of the body to be contacted and as a result a space, formed in the assembly position between the body to be contacted and the base structure 4, is sealed against the entry of air and/or moisture.

The device 2 furthermore comprises a contact element omitted from FIG. 1 to set up an electrically conducting connection to the body to be contacted, this omitted contact element when in the assembly position being held, for instance adhesively, at the side which in the assembly position faces the body to be contacted, that is as regards the embodiment of FIG. 1, at a radial inside surface 22 of the base structure 4 forming a retaining area.

The device 2 furthermore comprises adjusting means to adjust the contact element in its position relative to axial edges 24, 26 of the base structure 4 and constituted in this instance by rest edges 28, 30, 32 formed on studs 34, 36, 38 which are integrated into the sealing lips 14, 16 of the elastic part 12.

The studs 34, 36 run axially inward from the axial edge 26 of the base structure 4 whereas the stud 38 runs axially inward from the opposite axial edge 26, the studs 34, 36 being configured on a circumferential line 33 and the stud 38 being configured on a circumferential line 35 axially offset from the circumferential line 33.

Figure 2:
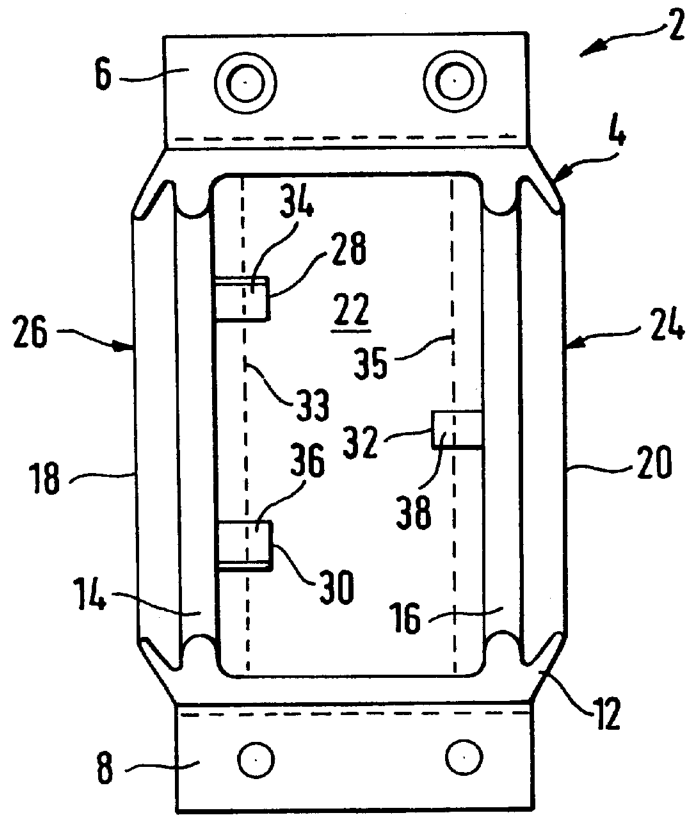
FIG. 2 is an elevation of the radial inside surface of the device of FIG. 1 without the contact element.

FIG. 2 shows an elevation of the radial inside surface 22 of the device 2.

Figure 3:
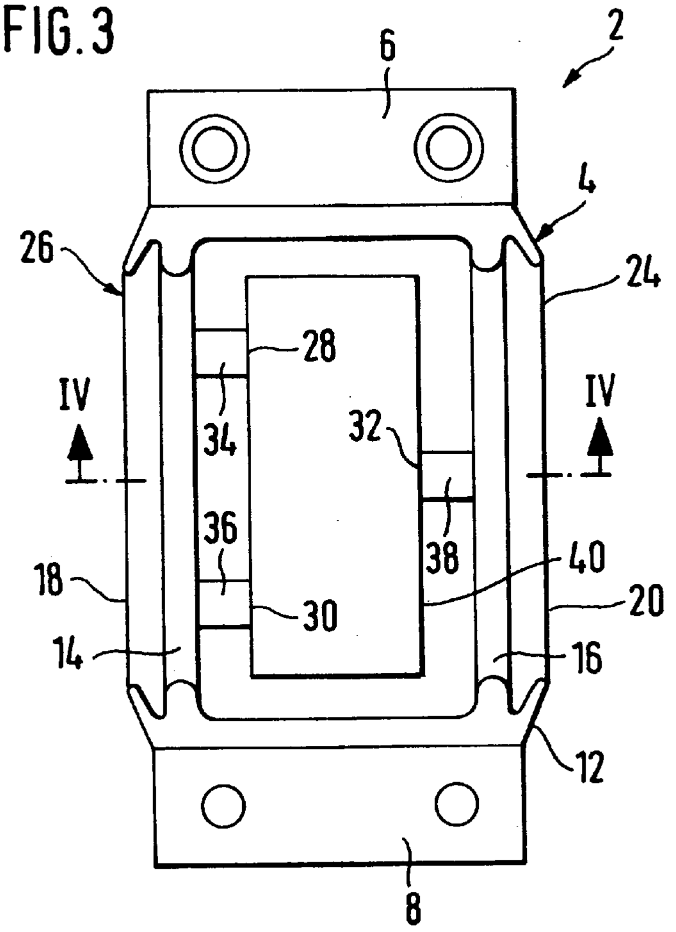
FIG. 3 is a view like FIG. 2 of the device of FIG. 2 with the contact element affixed to the base structure.

FIG. 3 shows the device 2 with a contact element 40 held against it which in this instance is made of electrically conducting graphite and which in topview is substantially rectangular. The contact element 40 is bonded adhesively to the radial inside surface 22 of the base structure 4.

FIG. 3 shows that in the affixation of this Figure, the contact element rests by mutually opposite zones of its edges against the rest edges 28, 30, 32 of the studs 34, 36, 38 which form centering means to center the contact element 40 between the mutually opposite axial edges 24, 26 of the base structure 4. The rest edges 28, 30, 32 ensure that the contact element 40 shall be kept in the desired position—wherein its longitudinal sides run substantially parallel to the axial edges 24, 26 of the base structure, 4—against the base structure and that it shall not project laterally. In this manner time-consuming and hence costly refinishing work, which otherwise would be required if the contact element 40 no longer were in the desired affixation position, will be avoided.

FIG. 4 shows a section along a line IV—IV in FIG. 3 of the device 2 in the assembly position wherein the base structure 4 rests by the sealing lips 14, 16 and the additional sealing lips 18, 20 against a body to be contacted, which, as regards FIG. 4, is a coaxial cable. In order to make contact with a bared outer conductor 44 of the coaxial cable 42 in a contact zone 46, the contact element 40 projects so much radially toward the coaxial cable 42 that it rests against the bared outer conductor 44 when the sealing lips 14, 16 and resp. 18, 20 resting against a sheath 48 of the coaxial cable, and thus it implements an electrically conducting connection with this outer conductor.

FIG. 4 shows that the contact element 40 is snugly held at mutually opposite zones of its edges by the studs 34, 38 and thereby is centered between the axial edges 24, 26 of the base structure 4 in the desired affixation position.

Figure 5:
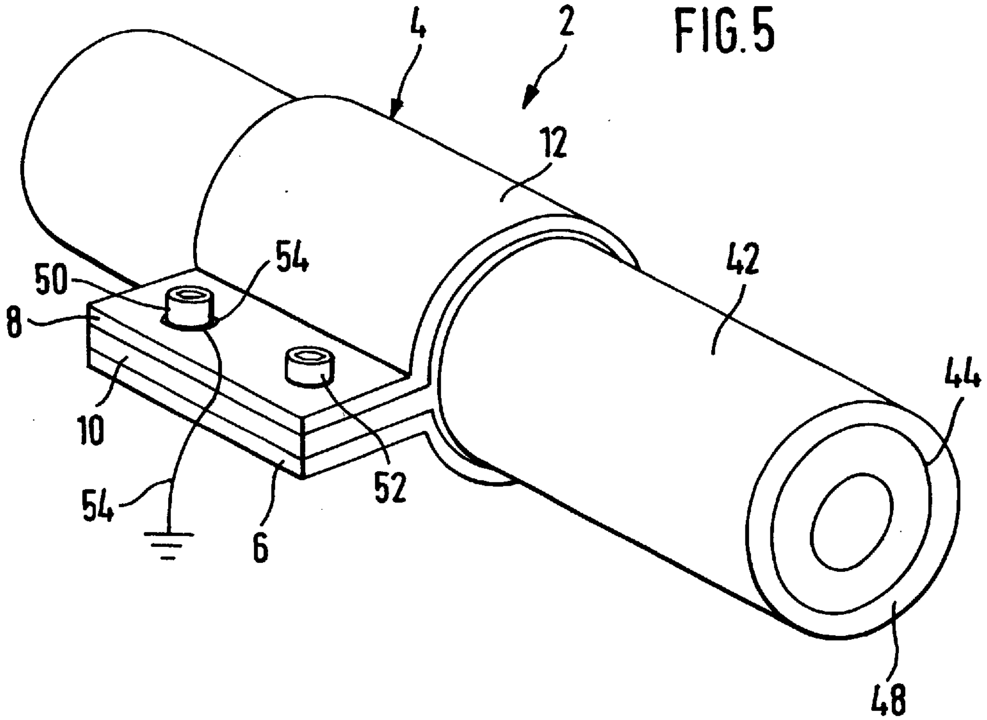
FIG. 5 is a schematic perspective of the device of FIG. 1 in the assembly position.

FIG. 5 shows the device 2 of FIG. 1 in the assembly position wherein the base structure 4 encloses like a bush the coaxial cable 42 to be contacted. To affix the device 2 to the coaxial cable 42, the base structure 4, which is in the form of a clamp, is tensioned, around the coaxial cable 42 to be contacted, by metal screws 50, 52 which pass through boreholes in the bracket 8 and engage threaded boreholes formed in the bracket 6. When tightening the base structure 4, the sealing lips 14, 16 and the additional sealing lips 18, 20 come to rest in sealing manner against the sheath 48 of the coaxial cable 42 and as a result they seal the space formed in the assembly position between the coaxial cable 42 and the base structure 4 against entry of air and/or moisture.

When the base structure 4 is tightened, the contact element 40 comes to rest against the bared outer conductor 44 of the coaxial cable 42 and as a result the contact element 40 implements an electrically conducting connection between the outer conductor 44 and the metal part 10 of the base structure 4. The metal part 10 extending as far as into the brackets 6, 8, the screws 50, 52 allow implementing an electrically conducting connection with a conductor, for instance a grounding cable 54 schematically indicated in FIG. 5. For that purpose the grounding cable 54 may be connected by a connecting grommet to the screw 50. As a result an electrically conducting connection has been set up in the desired manner between the grounding cable 54 and the outer conductor 44 of the coaxial cable 42 and consequently this outer conductor 44 is grounded.

Figure 6:
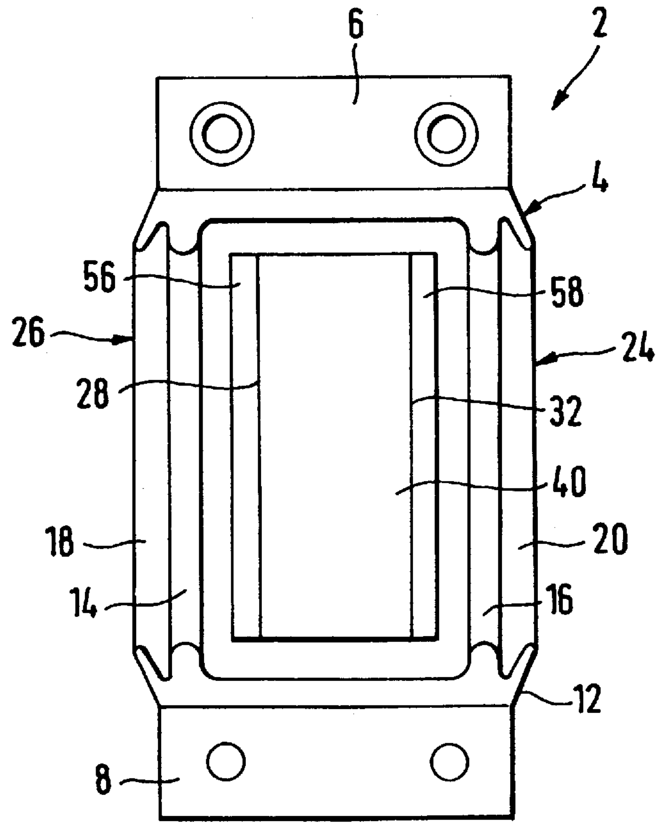
FIG. 6 is the same view as in FIG. 3 of a second embodiment of the device of the invention.

FIG. 6 shows a second embodiment of the device of the invention 2 which differs from the embodiment of FIGS. 1 through 5 in that the rest edges 28, 32 are formed on ribs 56, 58 which run substantially parallel to the adjacent axial edges 24, 26 of the base structure 4. The elastic part 12 illustratively may be placed around the axial edges 24, 26 of the base structure 4 to form the ribs 56, 58. It is shown also that the contact element 40 rests by its full length by means of mutually opposite zones of its edge against the ribs 56, 58 and as a result is centered between the axial edges 24, 26 of the base structure 4.

Figure 7:
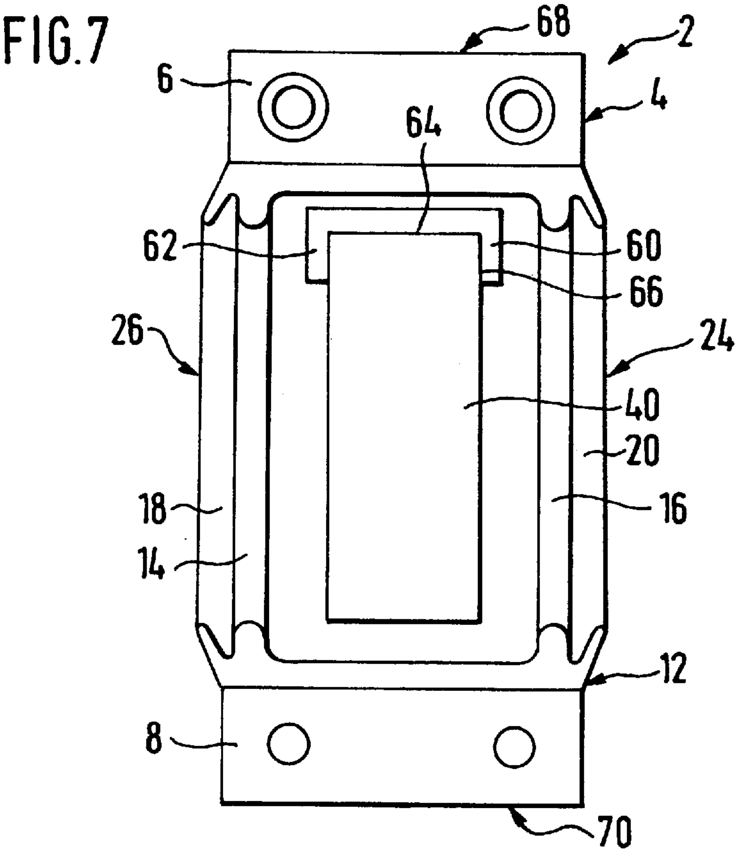
FIG. 7 is the same view as in FIG. 3 of a third embodiment of the device of the invention.

FIG. 7 shows a third embodiment of the device of the invention 2 which differs from that of the embodiment of FIG. 6 in that a rib 60 assuming substantially a U shape in topview is formed in the region of the bracket 6 at the radial inside surface 22 of the base structure 4 and the rib surfaces facing the contact element 40 form rest edges 62, 64, 66 supporting the contact element 40 in the assembly position and this contact element 40 being centered between the mutually opposite axial edges 24, 26 and mutually opposite circumferential edges 68, 70 of the base structure 4.

Figure 8:
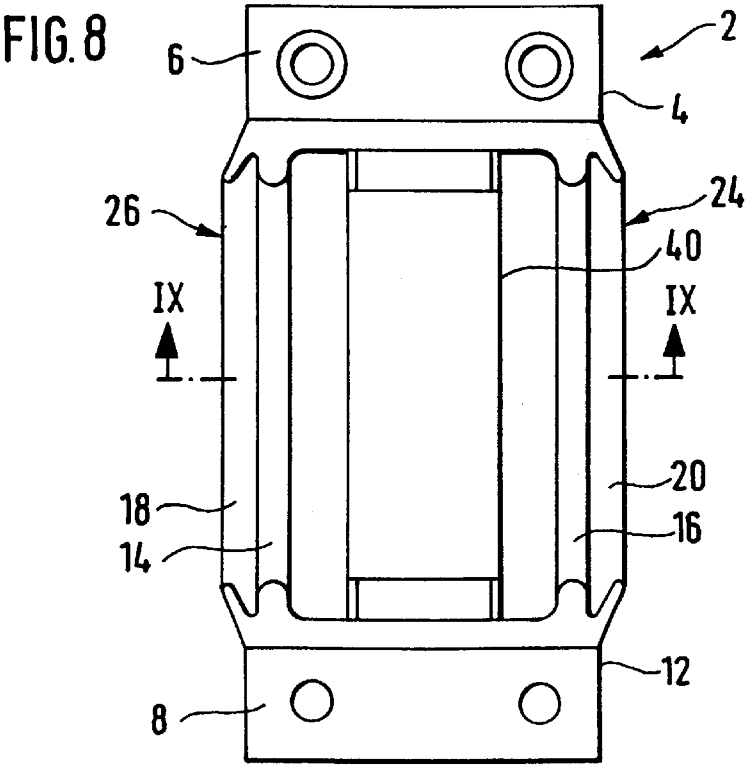
FIG. 8 is the same view as in FIG. 4 of a fourth embodiment of the device of the invention.

FIG. 8 shows a fourth embodiment of the device of the invention 2 which differs from the previous embodiments in that adjusting means comprise rest surfaces constituted by slopes 74, 76 of a bead 72 running in the circumferential direction of the base structure 4.

Figure 9:
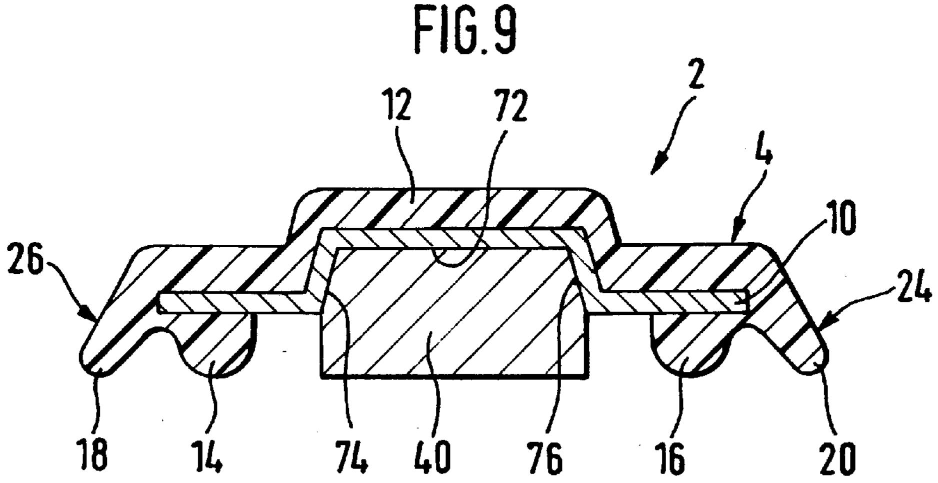
FIG. 9 is a section along a line IX—IX through the device of the invention of FIG. 8.

FIG. 9 shows that the mutually facing slopes 74, 76 of the bead 72 constitute rest surfaces for the contact element 40 and are spaced apart in the axial direction of the base structure 4 in such manner that the contact element 40 tightly rests against the slopes 74, 76 and that in this manner the contact element 40 is centered between the axial edges 24, 26 of the base structure 4. A recessed zone of which the contour substantially matches that of the contact element 40 may replace the bead 72, whereby the contact element 40 is tightly received by its edge in the recess and thus is centered.

Figure 10:
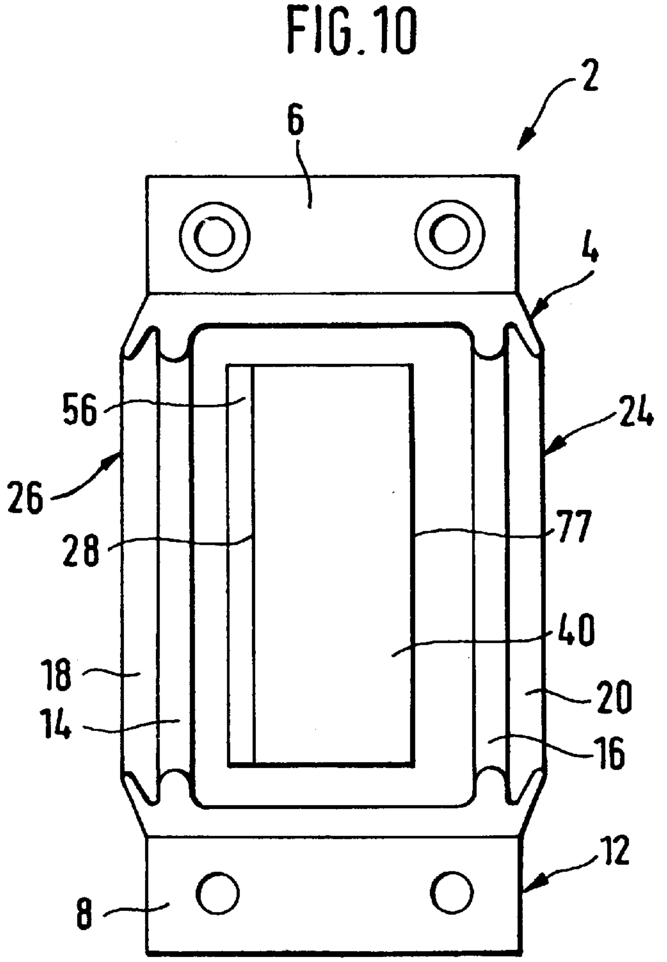
FIG. 10 is the same view as in FIG. 3 of a fifth embodiment of the device of the invention.

FIG. 10 shows a fifth embodiment of the device of the invention 2 which differs from that of FIG. 6 merely in that it comprises a rib 56 with a rest edge 28 against which rests the contact element. To fix it in position, the contact element 40 can be bonded at a zone of its edge away from the rib 56 for instance by a linear deposit of adhesive symbolically denoted in FIG. 10 by a dashed line 77 to the radial inside surface of the base structure 4. Instead of linear adhesive bonding, one or more adhesive spots also may be used as the bonding means.

Figure 11:
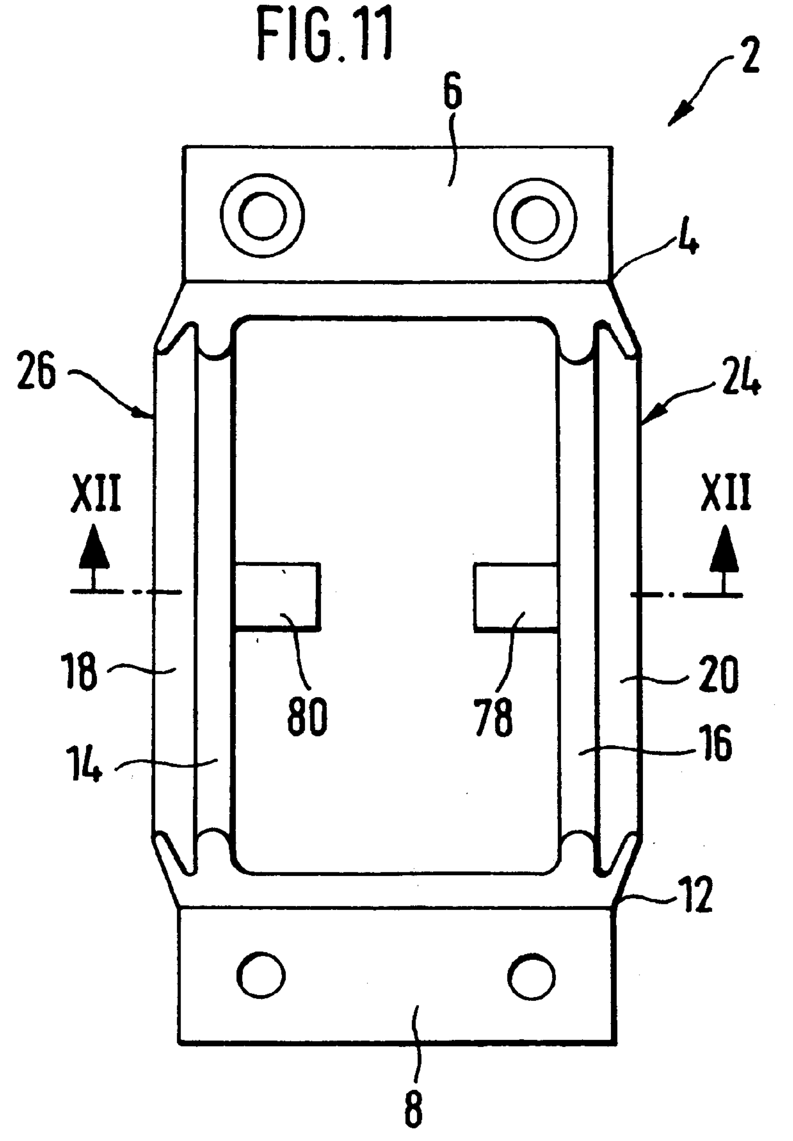
FIG. 11 is the same view as in FIG. 3 of a sixth embodiment of the device of the invention without the contact element.

FIG. 11 shows a sixth embodiment of the device of the invention 2 which differs from that of FIG. 3 in that it comprises two studs 80, 78 where the stud 80 runs from the axial edge 26 of the base structure 4 toward the opposite, axial edge 24 and the stud 78 runs from the axial edge toward the opposite edge 26. The studs 80, 78 are configured substantially along a line running in the axial direction of the base structure 4.

Figure 12:
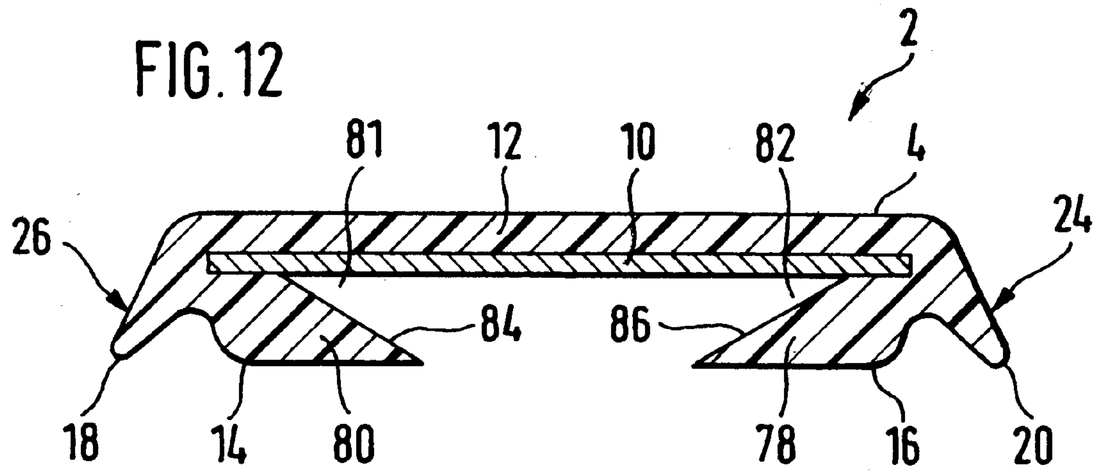
FIG. 12 is a section along a line XII—XII in FIG. 11.
Figure 13:
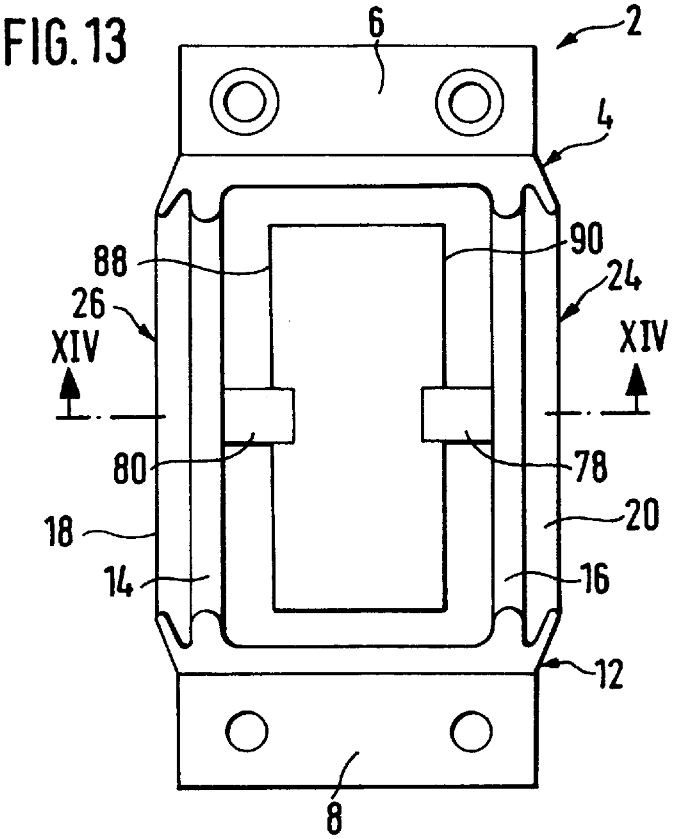
FIG. 13 is the same view as in FIG. 11 of the device shown in FIG. 11 with a contact element held against the base structure.
Figure 14:
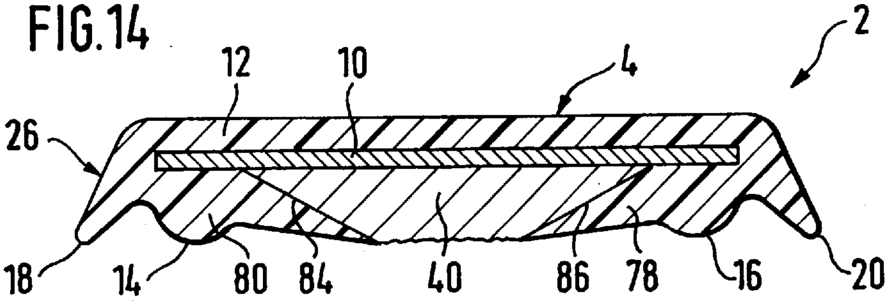
FIG. 14 is a section along a line XIV—XIV in FIG. 13.

FIG. 12 shows that the studs 80, 78 are fitted with undercuts 81, 82 in such manner that rest surfaces 84, 86 slanting toward each other are formed on the studs 80, 78 with which these studs when in the affixation position overlap mutually opposite zones 88, 90 of the edge of the contact element 40 as also shown in FIGS. 13 and 14. To affix the contact element 40, which in this embodiment is a flat, flexible, metal braid, to the base structure 4, this structure is inserted by its edges 88,90 and possibly with elastic deformation of the studs 80, 78 into the region of the undercuts 81, 82, where the studs 80, 78 overlap the edges 88, 90 of the contact element 40, and the rest surfaces 84, 86 come to rest against the contact element 40. In this manner the contact element 40 is held reliably, without additional retention means such as adhesive, at the base structure 4 and is centered between the axial edges 24, 26 of the base structure 4.

Figure 15:
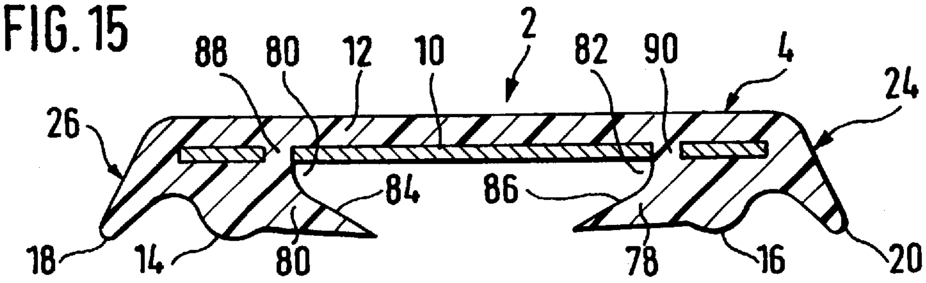
FIG. 15 is the same view as in FIG. 12 of a seventh embodiment of the device of the invention.

FIG. 15 shows a seventh embodiment of a device of the invention 2 essentially differing from that of FIG. 12 in that the metal part 10 on both sides of the contact element 40 (omitted from FIG. 15) comprises apertures 88, 90 through which passes the elastic material of part 12 in such manner that the elastic material on the side of the metal part 10 facing the contact element 40 is joined to the elastic material on the side of the metal part 10 away from the contact element 40. In this manner a permanent electrically conducting connection is assured between the metal part 10 and the contact element 40 even when the contact element is held to the metal part 10 without additional retention means.

While this invention has been described as having a preferred design, it is understood that it is capable of further modifications, and uses and/or adaptations of the invention and following in general the principle of the invention and including such departures from the present disclosure as come within the known or customary practice in the art to which the invention pertains, and as may be applied to the central features hereinbefore set forth, and fall within the scope of the invention or limits of the claims appended hereto.

I claim:

1. A device for providing electrical contact to an outer conductor of a coaxial cable, the outer conductor having at least one bare segment, said device comprising:

a) a base structure, said base structure comprising a clamp adapted to be clamped around a coaxial cable to be contacted said base structure provided with an interior surface and an exterior surface;

b) sealing lips operatively associated with said base structure and forming a part thereof and extending from said interior surface thereof, said sealing lips for providing a seal between said base structure and the coaxial cable when said base structure is tensioned therearound;

c) an electrically conducting contact element attached to said base structure wherein when said base structure is tensioned around the coaxial cable said electrically conducting contact element will rest against the bare segment of the coaxial cable and provide electrical contact therewith; and d) adjusting accessories for maintaining the position of said band shaped electrically conducting contact element during affixation to said base structure, said adjusting accessories selected from the group consisting of at least one rest edge and at least one rest surface, said at least one rest surface sloping with respect to a retaining surface at which said contact element is affixed to said base structure, said band shaped electrically conducting contact element rests against at least one of said at least one rest edge and said at least one rest surface when affixed to said base structure, each of said at least one rest edge and said at least one rest surface being located axially inward from said sealing lips at a protrusion, said protrusion is at least one of a stud or a rib.

2. A device as claimed in claim 1 and wherein said at least one rest edge includes two rest edges, each of said at two rest edges is separately spaced along different regions along an edge of said band shaped electrically conducting contact element.

3. A device as claimed in claim 2 and wherein said adjusting accessories include means for centering said band shaped electrically conducting contact element between mutually opposed opposite edges of said base structure.

4. A device as claimed in claim 3 and wherein said centering means comprises said two rest edges arranged in a mutually parallel relation and also in a parallel relation relative to a separate one of said opposite edges of said base structure.

5. A device as in claim 3 and wherein said at least one rest surface includes two rest surfaces, each of said two rest surfaces extends in at least one of a longitudinal direction or a circumferential direction of said base structure and against said band shaped electrically conducting contact element when said electrically conducting contact element is affixed to said base structure.

6. A device as in claim 5 and wherein each of said two rest surfaces having a slope at least one of in a direction away from each other or towards each other.

7. A device as in claim 2 and wherein said base structure includes a part constructed from an elastomeric material and said at least one of a stud or rib is integrated therein.

8. A device as in claim 7 and wherein said base structure includes a band shaped metal part.

9. A device as in claim 8 and wherein said band shaped metal part is at least partly coated with said elastomeric material and on a side thereof disposed away from mutually opposite zones of said different regions of said band shaped electrically conducting contact element edge.

10. A device as in claim 9 and wherein said band shaped metal part provided with at least two spaced apertures extending therethrough and each of said at least two spaced apertures is disposed in said band shaped metal part at a location adjacent a different side of said band shaped electrically conducting contact element and said elastomeric material extends through each of said at least two apertures.

11. A device as in claim 1 and wherein said at least one stud includes at least three studs each of which extends from one of said sealing lips in at least one of a longitudinal direction or a circumferential direction of said base structure and in a staggered relation relative to each other.

12. A device as in claim 1 and wherein said at least one stud includes at least two studs which are aligned in the axial direction of said base structure.

13. A device as in claim 1 and wherein said at least one stud includes at least two studs each of which provided with at least one rest surface sloping towards the other of said at least two studs so that when said contact element is affixed to said base structure each of said at least two studs will overlap mutually opposite zones of an edge of said band shaped electrically conducting contact element.

14. A device as in claim 1 and wherein said contact element is selected from the group consisting of a flat stranded wire, a flat metal band and a braided metal band.

* * * * *